United States Patent
Nejad et al.

(10) Patent No.: US 7,306,954 B2
(45) Date of Patent: Dec. 11, 2007

(54) PROCESS FLOW FOR BUILDING MRAM STRUCTURES

(75) Inventors: Hasan Nejad, Boise, ID (US); James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 714 days.

(21) Appl. No.: 10/637,096

(22) Filed: Aug. 8, 2003

(65) Prior Publication Data
US 2004/0027844 A1 Feb. 12, 2004

Related U.S. Application Data

(62) Division of application No. 10/198,194, filed on Jul. 17, 2002, now Pat. No. 6,828,639.

(51) Int. Cl.
*H01L 21/8244* (2006.01)
(52) U.S. Cl. .................. 438/3; 438/672; 438/692; 257/E27.006; 257/E21.665
(58) Field of Classification Search .................. 438/3, 438/672, 692; 365/225.5, 173, 158; 257/E27.006, 257/E21.665
See application file for complete search history.

(56) References Cited

U.S. PATENT DOCUMENTS

| | | | |
|---|---|---|---|
| 6,048,739 A | 4/2000 | Hurst et al. | |
| 6,153,443 A * | 11/2000 | Durlam et al. | 438/3 |
| 6,219,274 B1 | 4/2001 | Shimazawa et al. | |
| 6,458,603 B1 * | 10/2002 | Kersch et al. | 438/3 |
| 6,485,989 B1 | 11/2002 | Signorini | |
| 6,521,931 B2 * | 2/2003 | Sandhu et al. | 257/295 |
| 6,653,154 B2 * | 11/2003 | Doan et al. | 438/3 |
| 6,764,865 B2 * | 7/2004 | Kajiyama | 438/3 |
| 6,828,639 B2 | 12/2004 | Nejad et al. | |
| 2003/0179601 A1 | 9/2003 | Seyyedy et al. | |
| 2004/0027844 A1 * | 2/2004 | Nejad et al. | 365/1 |
| 2004/0175845 A1 * | 9/2004 | Molla et al. | 438/3 |
| 2004/0191981 A1 * | 9/2004 | Yates et al. | 438/238 |
| 2004/0201070 A1 * | 10/2004 | Deak | 257/421 |
| 2005/0052938 A1 * | 3/2005 | Horikoshi | 365/232 |
| 2005/0076580 A1 * | 4/2005 | Tamboli et al. | 51/307 |
| 2006/0003471 A1 * | 1/2006 | Deak | 438/3 |

* cited by examiner

*Primary Examiner*—George Fourson
(74) *Attorney, Agent, or Firm*—Knobbe Martens Olson & Bear LLP

(57) ABSTRACT

MRAM structures employ the magnetic properties of layered magnetic and non-magnetic materials to read memory storage logic states. Improvements in switching reliability may be achieved by altering the shape of the layered magnetic stack structure. Forming recessed regions with sloped interior walls in an ILD layer prior to depositing the layered magnetic stack structure produces a significant advantage over the prior art by allowing a CMP process to be used to define the magnetic bit shapes. The sloped interior walls of the recessed regions, which is singular to the present invention, provide a unique formation and shaping of the magnetic stack structure, which may reduce the magnetic coupling effect between magnetic layers of the magnetic stack structure.

9 Claims, 7 Drawing Sheets

PROCESS FLOW FOR BUILDING MRAM STRUCTURES

RELATED APPLICATIONS

This application is a divisional application of U.S. application Ser. No. 10/198,194, filed Jul. 17, 2002, now U.S. Pat. No. 6,828,639 which is hereby incorporated by reference herein.

BACKGROUND OF THE INVENTION

1. Field of the Invention

The present invention relates to semiconductor processing technology and, in particular, concerns a device and a fabrication process, whereby a Magnetoresistive Random Access Memory (MRAM) structure can be formed.

2. Description of the Related Art

MRAM is a developing technology that offers the advantages of non-volatile memory with high-density fabrication. An MRAM structure employs the properties of layered magneto-resistive materials, which utilize the spin characteristics of electrons to produce a selective resistance differential across the MRAM structure. Changes in the spin characteristics of magneto-resistive materials result in changes in the resistance of the MRAM structure, and changes in resistance may be sensed thereby permitting the use of layered magneto-resistive materials in logic state devices.

MRAM devices typically include a pinned (spin stationary) layer, a soft (spin programmable) layer, and a non-magnetic layer interposed therebetween. The soft or sense layer may be programmed through the application of an external magnetic field and the net magnetization vectors between the programmable layer and the pinned layer may be changed between two discrete quantities, which may then be sensed to detect the programmed logic state of the MRAM device.

MRAM devices follow the same high-density fabrication techniques as their semiconductor counterparts. Integrated circuit (IC) fabrication techniques employ sequential steps of layered processing of materials. In one aspect, current manufacturing processes utilize a flow process that deposits a layered magnetic stack structure onto a substrate, where the deposition of the layered magnetic stack structure includes the deposition of the magnetic pinned layer, the non-magnetic layer, and the magnetic sense layer onto the substrate. Once the magnetic stack structure is deposited, the magnetic pinned layer is defined with a photo patterning and dry or wet etching process in a manner known in the art. The last step in the flow process planarizes the magnetic stack structure to define a plurality of magnetic bit shapes using a dry or wet etching process, and then a top electrode is added to complete the MRAM memory structure.

One disadvantage to utilizing a selective wet etching process and/or a dry etching process to define the magnetic bit shapes and/or the magnetic stack structure is that it leaves substantially rough edges, which may reduce the switching reliability of the MRAM device. In addition, another disadvantage is that utilizing a selective wet etching and/or a dry etching process may undercut the barrier layer, which undermines the integrity of the barrier layer and may cause electrical shorting of the magnetic sense layer and/or the magnetic pinned layer. The electrical shorting effect may also contribute to unreliable switching of the MRAM device due to an uncontrolled leakage current.

Still another disadvantage to a selective wet etching and/or a dry etching process is the generation of a non-uniform magnetic bit shape. A non-uniform magnetic bit shape may adversely effect the magnetic coupling and the resistance of the magnetic stack structure. Unfortunately, irregular shapes and non-uniform structures may produce unpredictable magnetic coupling patterns that may require a larger magnetic field for switching. An adverse increase in the magnetic coupling effect of the magnetic stack structure may require a larger magnetic field for switching, which may result in a larger current draw through the MRAM device. Additionally, increased resistance through the magnetic stack structure may also require a larger current draw through the MRAM device. As a result, an increase in the current consumption of the MRAM device reduces the power efficiency of the MRAM device, which is disadvantageous to low power requirements of some electronic devices, such as laptop computers and cellular phones.

Based on the foregoing, there currently exists a need for an improved magnetic memory device that comprises magnetic memory stack layers with improved magnetic coupling characteristics and stability. Furthermore, there also exists a need for a magnetic memory fabrication process that reduces the use of a selective wet etching process or a dry etching process to define the magnetic bit shapes and/or the magnetic stack structure in a manner so as to improve the switching reliability of the magnetic memory device.

SUMMARY OF THE INVENTION

The aforementioned needs are satisfied by the process flow for forming MRAM structures as described herein below. In one embodiment, the aforementioned needs may be satisfied by an MRAM cell comprising a substrate, a first electrode formed adjacent to the substrate, a pinned layer formed on the substrate so as to overlie the first electrode and be electrically coupled therewith, and an insulating layer formed on the pinned layer, wherein the insulating layer is formed so as to define a bit recess. In addition, the MRAM cell may further comprise a sense layer positioned in the bit recess such that regions of the sense layer at the outer perimeter of the bit recess produce a magnetic field that has a component directed away from the pinned layer, and a second electrode connected to the sense layer, wherein application of voltage differential between the first and the second electrode results in a change in the magnetic state of the sense layer thereby resulting in a detectable change in the resistance of the MRAM cell.

In one aspect, the substrate may be formed using a semiconductor based material, wherein the semiconductor based material includes a silicon wafer. The first electrode may be formed using a damascene process, wherein the first and second electrodes comprise a conductive material, such as copper. The pinned layer may produce a magnetic field with a component in a fixed direction. In addition, the pinned layer may comprise NiFe, the sense layer may comprise NiFeCo, and the insulating layer may comprise an insulating material selected from the group consisting of Silicon Dioxide, Tungsten, and Tantalum. Additionally, the bit recess may comprise sloped interior walls, wherein a barrier layer may be formed so as to interposedly contour the bit recess between the pinned layer and the sense layer. The barrier layer may comprise Aluminum Oxide. Moreover, the barrier layer and the magnetic sense layer may be planarized using a chemical-mechanical polishing technique so as to define a magnetic bit shape and stopping adjacent to the dielectric layer. The bit recess may comprise a recessed well that defines the magnetic bit shape, and the magnetic bit shape is elliptical and the recessed well has sloped interior walls.

In another embodiment, the aforementioned needs may be satisfied by an array of magnetic memory cells comprising a substrate, a first plurality of electrode traces formed in rows adjacent to the substrate, a plurality of pinned layers formed on the substrate so as to overlie the first plurality of electrode traces so as to be electrically coupled therewith, wherein each of the pinned layers provide a first magnetic component in a first direction, and a contiguous insulation layer formed in an overlying manner adjacent to the pinned layers and the substrate, wherein the contiguous insulation layer is formed so as to define an array of recessed wells. Additionally, the array of magnetic memory cells may further comprise an array of discrete soft layers overlying the array of recessed wells, wherein regions of the discrete soft layers produce a second magnetic component either in the first direction or in a second direction that is different from the first direction, and a second plurality of electrode traces formed in rows so as to overlie the array of discrete soft layers and be electrically coupled therewith, wherein conduction of voltage between the first and the second electrode results in a change in the direction of the magnetic component of the discrete soft layers thereby resulting in a detectable change in the resistance of the magnetic memory cells.

In still another embodiment, the aforementioned needs may be satisfied by a memory device formed adjacent to a substrate, wherein the memory device may comprise a lower electrode formed within the substrate, a dielectric layer formed adjacent to the substrate so as to define a recess above the lower electrode, a magnetic memory cell formed within the recess so as to contour the recess and electrically couple with the lower electrode, and an upper electrode formed above the magnetic memory cell and electrically coupled therewith. In one aspect, the lower electrode may be formed using a damascene process. The recess may comprise sloped interior walls and/or an elliptical recess with sloped interior side walls. The device may further comprise a thin dielectric layer having a via hole interposed between the magnetic memory cell and the upper electrode. Moreover, the magnetic memory cell may comprise an MRAM, wherein the magnetic memory cell comprises a lower magnetic sense layer, a barrier layer, an upper magnetic pinned layer, and a CMP stop layer.

In yet another embodiment, the aforementioned needs may be satisfied may an MRAM array comprising a plurality of lower electrode traces formed in rows adjacent to a substrate and a contiguous dielectric layer formed adjacent to the substrate so as to define an array of recessed wells with sloped interior walls above the plurality of lower electrode traces. In addition, the MRAM array may further comprise a plurality of MRAM cells formed within the array of recessed wells so as to contour the recess and electrically couple with the lower electrode and a plurality of upper electrodes formed above the plurality of MRAM cells and electrically coupled therewith.

Moreover, the aforementioned needs may be satisfied by a method of fabricating a magnetic memory device having a magnetic stack structure interposed between a lower and upper electrode. In one embodiment, the method may comprise forming an insulating layer so as to define a recessed well above the lower electrode traces, forming the magnetic stack structure within the recessed wells above the lower electrode, planarizing the magnetic stack structure to define a magnetic bit shape using chemical-mechanical polishing, and forming the second electrode on the magnetic stack structure.

In another embodiment, a method of fabricating a magnetic memory device may be utilized, wherein the method may comprise forming a first electrode having an upper exposed surface within a substrate using a damascene process, forming a magnetic pinned layer on the upper exposed surface of the first electrode so as to establish a conductive interconnection therewith, forming a dielectric layer adjacent to the substrate so as to provide a recessed region with sloped interior side walls adjacent to the magnetic pinned layer for the subsequent forming of an overlying barrier layer and a magnetic sense layer. The method may further comprise depositing the barrier layer overlying the magnetic pinned layer, depositing the magnetic sense layer overlying the barrier layer, planarizing the barrier layer and the magnetic sense layer so as to define at least one magnetic bit shape using a chemical-mechanical polishing technique and stopping adjacent to the dielectric layer, and forming the second electrode on the magnetic sense layer so as to establish a conductive interconnection therewith.

In still another embodiment, a method of fabricating a magnetic memory device on a substrate may comprise forming a lower electrode having an upper exposed surface within the substrate using a damascene process, forming a thick dielectric layer adjacent to the substrate so as to provide a recessed region above the upper exposed surface of the lower electrode, forming a magnetic pinned layer on the thick dielectric layer so as to overlie the recessed region, and forming a barrier layer that overlies the magnetic pinned layer. Additionally, the method may further comprise forming a magnetic sense layer that overlies the barrier layer, forming a CMP stop layer that overlies the magnetic sense layer, and planarizing the magnetic pinned layer, the barrier layer, the magnetic sense layer, and the CMP stop layer to define at least one magnetic bit shape using a chemical-mechanical polishing technique and stopping adjacent to the thick dielectric layer. Moreover, the method may comprise forming a thin dielectric layer adjacent to the thick dielectric layer and the CMP stop layer, forming at least one via hole in the thin dielectric layer so as to provide an opening adjacent to the CMP stop layer, and forming an upper electrode on the thin dielectric layer adjacent to the via holes so as to provide conductive contact to the CMP stop layer.

These and other objects and advantages of the present invention will become more fully apparent from the following description taken in conjunction with the accompanying drawings.

DETAILED DESCRIPTION OF THE PREFERRED EMBODIMENT

Reference will now be made to the drawings wherein like numerals refer to like parts throughout. FIGS. 1A–1K illustrate one embodiment of a partially formed MRAM magnetic memory cell array with rows of continuous pinned layers. In one aspect, a continuous pinned layer between magnetic memory cell devices may reduce the magnetic coupling effect between the magnetic pinned layers and the magnetic sense layers of the magnetic memory cell devices. By reducing the magnetic coupling effect in MRAM devices, an advantageous increase in the switching reliability of the MRAM devices may result, which will be described in greater detail herein below.

Figure 1A:
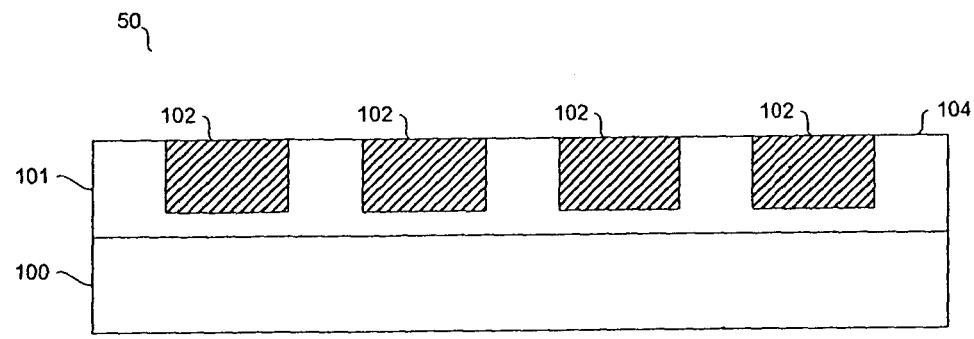
FIGS. 1A–1K illustrate one embodiment of a partially formed MRAM magnetic memory cell array with a continuous magnetic pinned layer.

FIG. 1A illustrates one embodiment of a substrate 100 comprising an array of lower metal electrodes 102. The substrate 100 material may comprise a first interlayer dielectric (ILD) layer 101 formed on a semiconductor wafer, such as a generally known silicon wafer that is used in the semiconductor fabrication industry. The first ILD layer 101 may comprise an insulating material, such as Silicon-dioxide ($SiO_2$), and a thickness of at least the thickness of the lower metal electrodes 102. The first ILD layer 101 may be deposited using a chemical vapor deposition (CVD) technique and planarized using a CMP process prior to forming the lower metal electrodes 102. The lower metal electrodes 102 may be formed on the first ILD layer 101 using a damascene process and positioned substantially parallel to each other. The substrate 100, including the first ILD layer 101, may further comprise a substrate surface 104. In one aspect, the damascene process for the formation of the lower metal electrodes 102 proceeds as follows. Prior to forming the lower metal electrodes 102, the lower electrode vias are patterned and etched into the first ILD layer 101 in a manner known in the art. A conductive material, such as copper, is then deposited into the lower electrode vias using, in one embodiment, a chemical vapor deposition (CVD) technique, plasma enhanced CVD, vacuum evaporation electroplating, or sputtering technique. In one aspect, as a conductive interconnection material, copper offers lower resistance and increased resistance to electromigration relative to aluminum.

Next, a chemical-mechanical polishing (CMP) process is utilized to evenly planarize features across the surface 104 of the first ILD layer 101. As a result, the CMP planarization process applies a substantially uniform material removal rate across the plane of the substrate surface 104, which substantially ensures that the substrate 100 is uniformly reduced in height across the plane of the substrate surface 104.

Figure 1B:
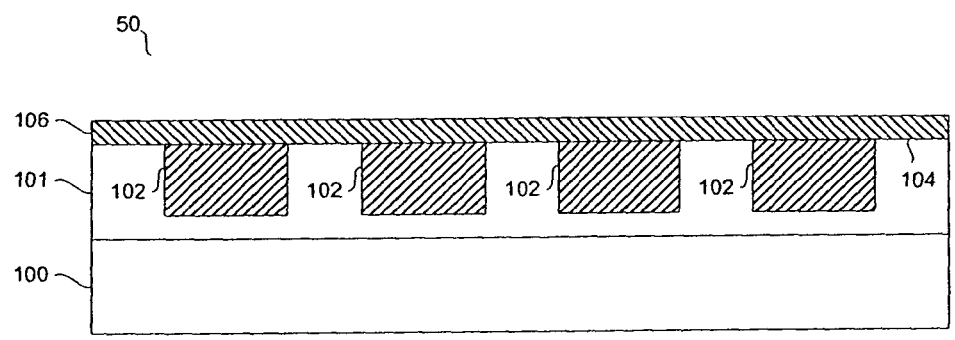

FIG. 1B illustrates the partially formed memory cell array 50 in FIG. 1A with the addition and the formation of a contiguous magnetic pinned layer 106 substantially adjacent to the substrate surface 104. In one aspect, the magnetic pinned layer 110 comprises a layer of magnetic material, such as a layer of NiFe that is approximately 150 Angstroms thick. Stack layers, including the magnetic pinned layer 106, are formed in a manner well known in the art by deposition techniques such as CVD, plasma enhanced CVD, sputter-deposition, physical vapor deposition, or ion-beam deposition. The magnetic pinned layer 106 may be magnetized in a first direction, which may be fixed, and functions as a first reference point for sensing the net directional magnetization vectors for a magnetic memory cell. In addition, positioning the magnetic pinned layer 106 on the substrate surface 104 results in a direct conductive link between the magnetic pinned layer 106 and the lower metal electrodes 102.

Figure 1C:
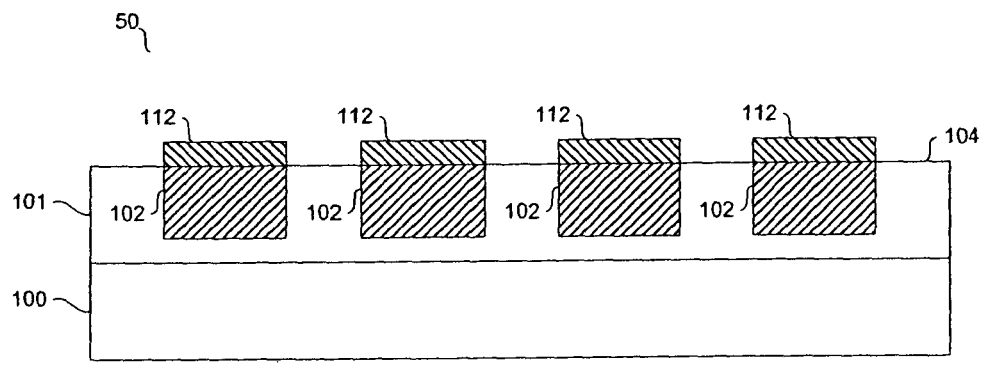

FIG. 1C illustrates the partially formed memory cell array 50 in FIG. 1B with the addition and the formation of a plurality of continuous pinned layers 112 in rows on the substrate surface 104. The plurality of continuous pinned layers 112 are patterned and etched using a photo masking technique in a manner known in the art. In addition, the patterned photo mask is positioned on the upper surface of the pinned layer 106 between the lower metal electrodes 102. The rows of continuous pinned layers 110 are formed above the lower metal electrodes 102 by utilizing an etching process above the lower metal electrodes 102, respectively. In one aspect, the rows of continuous pinned layers interlink neighboring MRAM memory cells. Additionally, the individual pinned layers 112 will help define the array of individual MRAM magnetic memory cells, which will be discussed in greater detail herein below with reference to FIG. 1K.

Advantageously, the formation of the continuous pinned layers may contribute to a reduction of the magnetic coupling effect between layered magnetic materials of magnetic memory cell devices. By reducing the magnetic coupling effect between magnetic layers in the magnetic memory cell devices, an advantageous increase in the switching reliability of the magnetic memory cell devices may result from the existence of the continuous pinned layer 112 in magnetic memory cell arrays. Furthermore, the process of forming continuous pinned layers 112 above the lower metal electrodes 102 substantially reduces the need for wet etching the magnetic stack structure as a whole, which solves the edge roughness and damaging of the barrier layer as will be described in greater detail herein below.

Figure 1D:
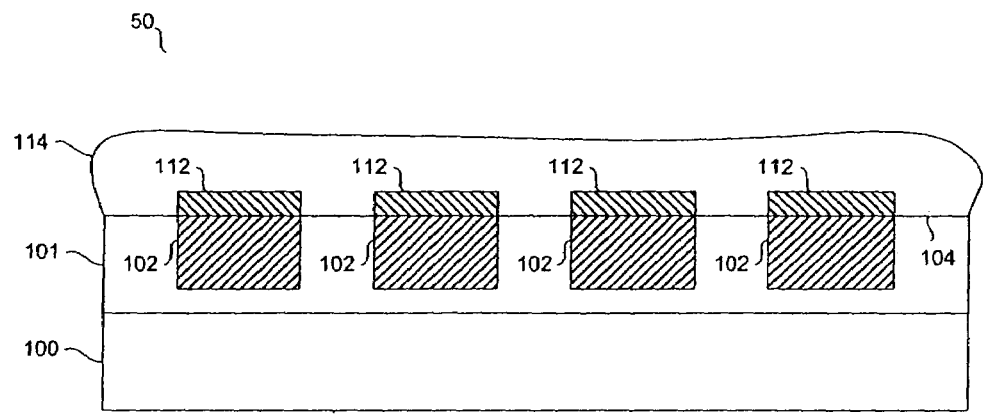

FIG. 1D illustrates the partially formed memory cell array 50 in FIG. 1C with the addition and the formation of a second interlayer dielectric (ILD) layer 114 substantially adjacent to the substrate surface 104 and to the plurality of individual pinned layers 112. The second ILD layer 114 comprises an insulating material, such as Silicon-dioxide ($SiO_2$), that is approximately 4 to 5 times as thick as the magnetic pinned layer 106 thickness. In one aspect, the second ILD layer 114 may be deposited using a chemical vapor deposition (CVD) technique.

Figure 1E:
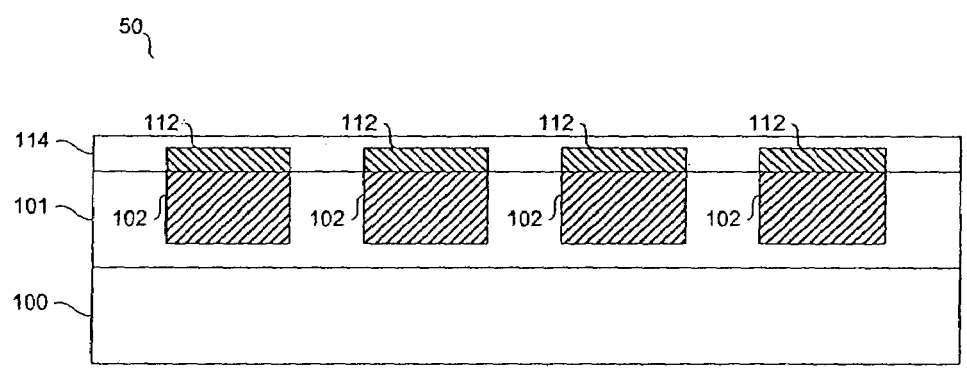

FIG. 1E illustrates the partially formed memory cell array 50 in FIG. 1D with the planarization of the second ILD layer 114. A CMP process is used to planarize the second ILD layer 114 to within a few hundred angstroms above the upper surface of the individual pinned layers 112, which provides enough depth for the etching of a recessed region 116. This process will be further discussed in greater detail herein below with reference to FIG. 1F.

Figure 1F:
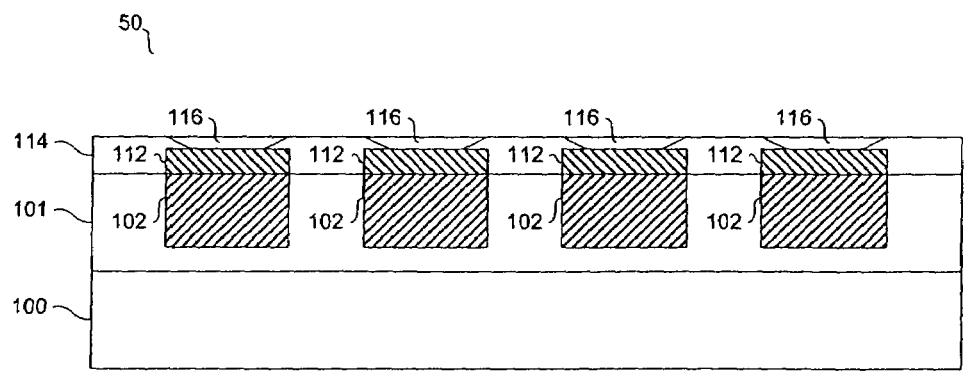

FIG. 1F illustrates the partially formed memory cell array 50 in FIG. 1E with the formation of the recessed region or magnetic bit shapes 116 on the upper surface of the second ILD layer 114. The magnetic bit shapes 116 may be formed using a pattern and etch technique to create recessed wells in the second ILD layer 114. In addition, the etching process of the magnetic bit shapes 116 may be stopped significantly close to the upper surface of the individual pinned layers 112.

In one aspect, the etched magnetic bit shapes 116 may be elliptical in appearance and comprise sloped interior side walls. An anisotropic etching technique may be used to form the sloped interior walls of the recessed regions of the magnetic bits shapes 116. As is known in the art, anisotropic etching of recessed cavities involves different etch rates in different directions of a material such that material may be etched in a direction other than vertical or substantially perpendicular to the etched layer surface. In addition, the sloped interior walls produce a large diameter at the top and a small diameter at the bottom of the magnetic bit shapes 116. The sloped shape may reduce the electrical shorting of the upper electrode 124 to the edges of the magnetic memory cells, which will be discussed in greater detail in FIG. 1I.

In another aspect, the etched magnetic bit shapes 116 may appear as semispherical recessed cavities with concaved interior walls. In this particular embodiment, an isotropic etching technique may be used to form the rounded interior side walls of the recessed regions of the magnetic bits shapes 116. Similar to the sloped interior side walls, the rounded shape of the interior side walls may reduce the electrical shorting of the upper electrode 124 to the edges of the magnetic memory cells. It should be appreciated that various dry and/or wet etching techniques may also be used to produce the sloped and/or rounded interior side walls of the above-mentioned magnetic bit shapes 116 without departing from the scope of the present invention.

Figure 1G:
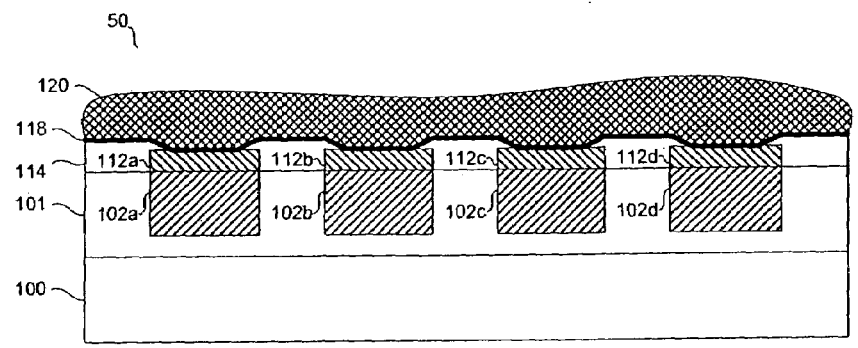

FIG. 1G illustrates the partially formed memory cell array 50 in FIG. 1F with the addition and the formation of a contiguous barrier layer 118 substantially adjacent to the upper surface of the second ILD layer 114 and the magnetic bit shapes 116. The barrier layer 118 comprises a layer of Aluminum-Oxide ($AlO_3$) that is approximately 10 to 15 Angstroms thick. Various fabrication techniques utilized for forming the barrier layer 118 include, first, depositing an aluminum layer using, in one embodiment, a CVD process in a manner well known in the art. Then, oxidation of the aluminum layer is achieved by one of several different methods: plasma oxidation, oxidation by air, and ion-beam oxidation, wherein all are derived in a manner well known in the art. In one aspect, the barrier layer 118 may function as an insulation region or layer, which resists dielectric breakdown and leakage current at particular voltages, such as low voltages.

FIG. 1G further illustrates the formation of a contiguous magnetic sense layer 120 substantially adjacent to the upper surface of the barrier layer 118. The magnetic sense layer 120 may comprise a layer of magnetic material, such as a layer of NiFeCo that is approximately 150 Angstroms thick and, in one embodiment, a top cap layer of Tantalum that is approximately 200–300 Angstroms thick. Stack layers, including the magnetic sense layer 120, are formed in a manner well known in the art by deposition techniques such as sputter-deposition, physical vapor deposition, or ion-beam deposition. In one aspect, the magnetic sense layer 120 may be selectively programmed or magnetized in the first direction or a second direction, which is different from the first, and functions as a second reference point for sensing the net directional magnetization vectors for a magnetic memory cell device, such as an MRAM cell.

Figure 1H:
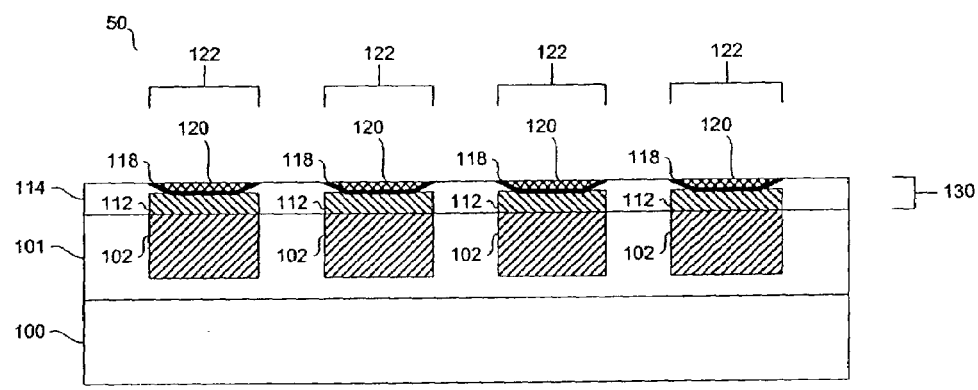

FIG. 1H illustrates the partially formed memory cell array 50 in FIG. 1G with the planarization of the barrier layer 118 and the magnetic sense layer 120. A CMP process is used to planarize the layers 118, 120 substantially close to the upper surface of the second ILD layer 114. The formation of the barrier layer 118 interposed between the magnetic sense layer 120, including, in one embodiment, the top cap Tantalum layer, and the etched pinned layer 112 represents one embodiment of a magnetic stack structure 130, which is comprised by the magnetic memory cell 122. Furthermore, this particular process maybe used to define a plurality of magnetic bits or magnetic memory cells 122, which will be further discussed in greater detail herein below.

In one aspect, creating the recessed regions for the magnetic bit shapes 116 by patterning and etching elliptical cavities in the second ILD layer 114 produces a significant advantage over the prior art by allowing a CMP process to be used to define the magnetic bit shapes 116. The prior art uses a pattern and etch technique to define the magnetic bit shapes, which reduces the integrity of the magnetic stack structure 130.

In addition, the sloped interior walls of the cavity help define the unique shape of the magnetic stack and present another advantage over the prior art. The unique shape of the magnetic stack structure 130 may reduce the magnetic coupling effect between the magnetic pinned layer 112 and the magnetic sense layer 120. The unique shape of the recessed cavities, which may include a semi-spherical recessed cavity, allows significant isolation of the layers 112, 118, 120 within the magnetic stack structure 130, which promotes increased switching reliability and structural integrity.

Furthermore, the depositing of the contiguous layers 118, 120 and then using a CMP process to define the magnetic memory cells 122 reduces the need for a pattern and etching process or technique to define the magnetic memory cells 122. The layering deposition technique and the subsequent CMP planarization process improves fabrication quality and efficiency by significantly reducing the edge roughness of the magnetic stack structure 130, decreasing barrier layer 118 damage, and increasing uniform shape definition of the magnetic memory cells 122.

Figure 1I:
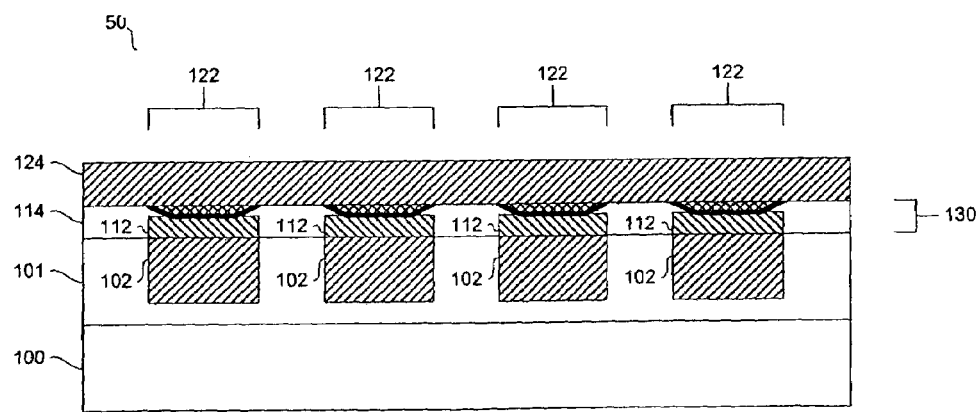

FIG. 1I illustrates the partially formed memory cell array 50 in FIG. 1A with the addition and the formation of upper metal electrodes 124 substantially adjacent to the upper surface of the second ILD layer 114 and the plurality of the magnetic memory cells 122. The upper metal electrodes 124 are positioned substantially parallel to each other and substantially orthogonal to the lower metal electrodes 102. The upper metal electrodes 124 comprise a metallic conductive material, such as copper, and are formed in a manner known in the art by using deposition techniques such as CVD, plasma enhanced CVD, vacuum evaporation electroplating, or sputtering techniques. In one aspect, this process further defines a plurality of magnetic bits or magnetic memory cells 122, which will be discussed in greater detail herein below in FIG. 1J.

Creating the recessed regions for the magnetic bit shapes 116 by patterning and etching recessed wells in the second ILD layer 114 produces a significant advantage over the prior art by allowing a CMP process to be used to define the magnetic memory cell 122. The prior art uses a pattern and etch technique, which reduces the integrity of the magnetic stack structure 130. The sloped interior walls of the cavity help define the unique shape of the magnetic stack and present another advantage over the prior art. Advantageously, the unique shape of the magnetic stack structures and structure 130 may reduce the undesirable magnetic coupling effect between the magnetic pinned layer 112 and the magnetic sense layer 120.

In one aspect, substantially uniform magnetic bit shapes may improve the magnetic coupling and the resistance of magnetic stack structures. Advantageously, regular shapes and substantially uniform structures may produce magnetic coupling patterns that may require a smaller magnetic field for switching. A beneficial reduction in the magnetic coupling effect of the magnetic stack structure may require a reduced magnetic field for switching, which may result in a lower current draw through the conductors. Moreover, reduced resistance through the magnetic stack structure may also require less current draw through the MRAM device. As a result, in one aspect, a reduction in the switching current consumption of the MRAM device may increase the power efficiency of the MRAM device, which is advantageous to low power requirements of some electronic devices, such as laptop computers and cellular phones.

Figure 1J:
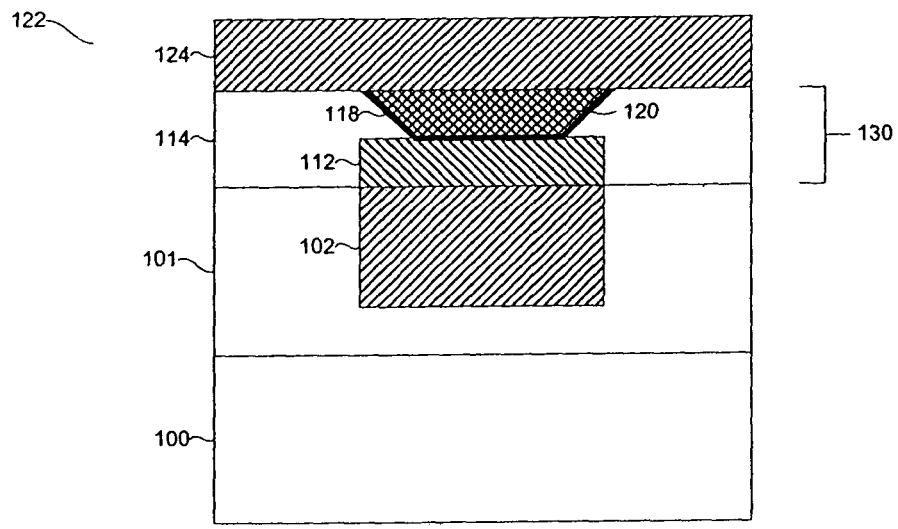

FIG. 1J illustrates the cross-sectional view of one embodiment of the magnetic memory cell 122. Each magnetic memory cell 122 comprises the lower metal electrode 102, the etched pinned layer 112, the barrier layer 118, the magnetic sense layer 120, and the upper metal electrode 124.

In one embodiment, the lower metal electrode 102 is formed within the substrate 100 using a damascene process, which was previously discussed in FIG. 1A. The etched pinned layer 112 is formed substantially adjacent to the upper surface of the lower metal electrode 102. Moreover, the barrier layer 118 is formed substantially adjacent to the upper surface of the etched pinned layer 112. Next, the magnetic sense layer 120 is formed substantially adjacent to the upper surface of the barrier layer 118. In addition, the upper metal electrode 124 is formed substantially adjacent to the upper surface of the magnetic sense layer 120. This magnetic memory cell 122 structure represents one embodiment of an MRAM memory cell structure.

In one aspect, the formation of the barrier layer 118 interposed between the magnetic sense layer 120 and the etched pinned layer 112 represents the magnetic stack structure 130, which is comprised by the magnetic memory cell 122. The lower and upper metal electrodes 102, 124 provide a conductive access to the magnetic memory cell 122. The conductive access is used to store and test for digital data bits in the magnetic memory cell 122 by testing the resistance of the magnetic stack structure 130. Moreover, the plurality of magnetic memory cells 122 are fabricated in an MRAM memory cell array 52, which is illustrated in FIG. 1K, where FIG. 1K illustrates the top view of FIG. 1H.

Figure 1K:
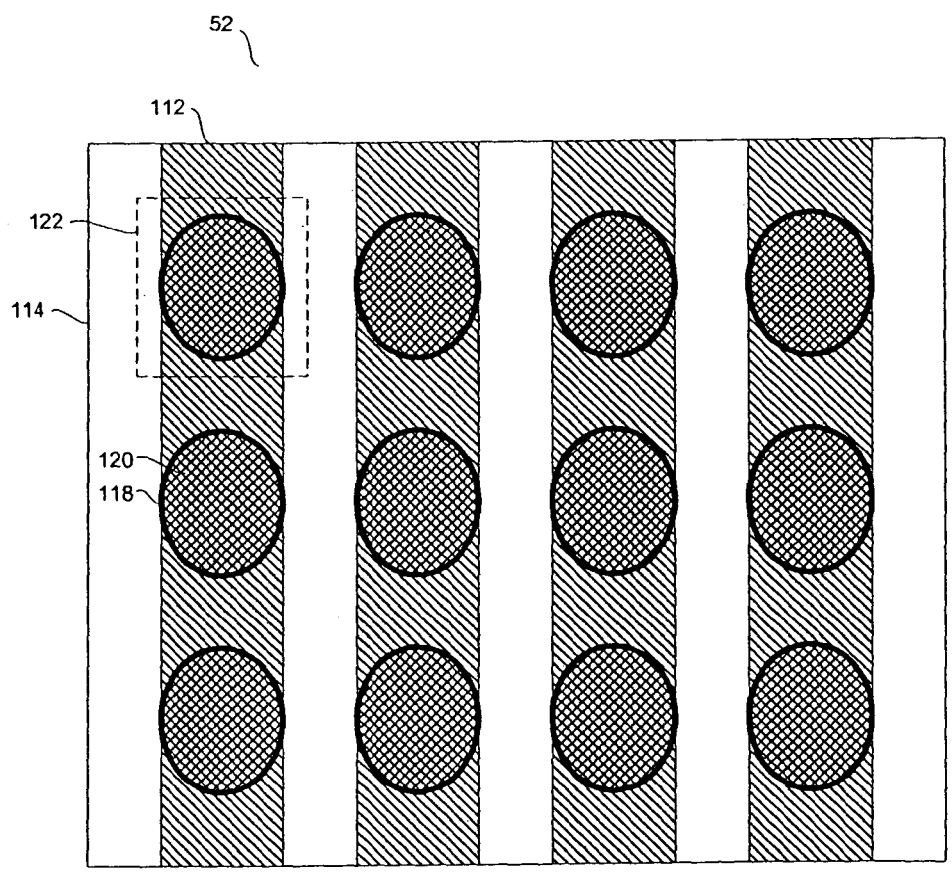

FIG. 1K further illustrates the continuous pinned layer 112 row configuration of the MRAM memory cell array 52. The formation of the continuous pinned layer may contribute to the reduction of the magnetic coupling effect between the magnetic pinned layer 112 and the magnetic sense layer 120 of an MRAM magnetic memory cell device 122. By reducing the magnetic coupling effect between layers 112, 120 in the MRAM device 122, an advantageous increase in the switching reliability of the MRAM device 122 may result from the existence of the continuous pinned layer 112 in the MRAM memory cell array 52. Furthermore, the process of forming continuous pinned layers 112 above the lower metal electrodes (not shown) substantially reduces the need for wet and/or dry etching the magnetic stack structure as a whole, which solves the edge roughness and damaging of the barrier layer. An improvement over the prior art processing technique is achieved by producing a more uniform shape definition.

FIGS. 2A–2G illustrate another embodiment of a partially formed MRAM magnetic memory cell array 250 with a discrete pinned layer. The discrete pinned layer reflects a modern MRAM device configuration, but the shape and the method of manufacturing the device is unique to the present invention.

Figure 2A:
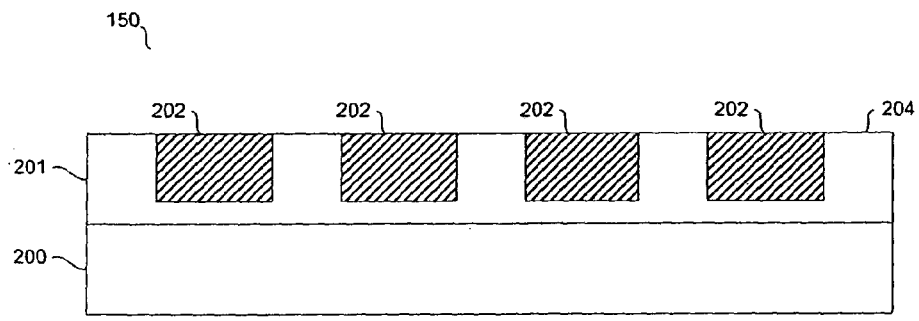
FIGS. 2A–2G illustrate another embodiment of a partially formed MRAM magnetic memory cell array with a discrete magnetic pinned layer.

FIG. 2A illustrates one embodiment of a substrate 200 comprising an array of lower metal electrodes 202. The substrate 200 material may comprise a first dielectric layer 201 formed on a semiconductor wafer, such as a generally known silicon wafer that is used in the semiconductor fabrication industry. The first ILD layer 201 may comprise an insulating material, such as Silicon-dioxide ($SiO_2$), Tungsten, or Tantalum, and a thickness of at least the thickness of the lower metal electrodes 202. The first ILD layer 201 may be deposited using a chemical vapor deposition (CVD) technique and planarized using a CMP process prior to forming the lower metal electrodes 202. In addition, the lower metal electrodes 202 may comprise a metallic conductive material, such as copper, and are formed on the first ILD layer 201 using a damascene process and positioned substantially parallel to each other. The substrate 200, including the first ILD layer 201, may further comprise a substrate surface 204. In one aspect, the damascene process utilized to form the lower metal electrodes 202 is similar in process flow to the damascene process previously discussed with reference to FIG. 1A.

Figure 2B:
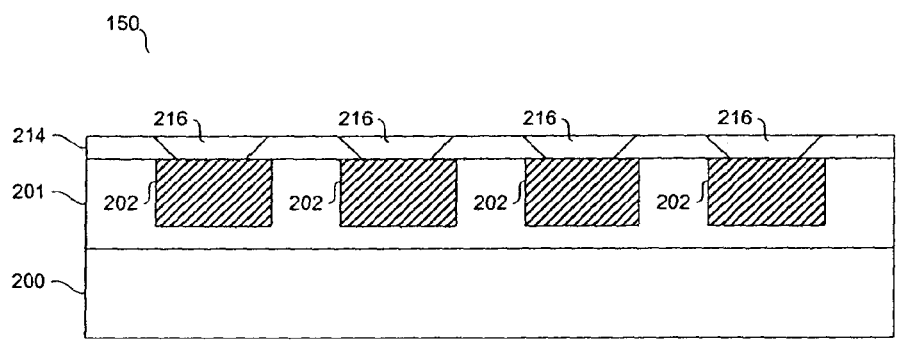

FIG. 2B illustrates the partially formed memory cell array 250 in FIG. 2A with the formation of the magnetic bit shapes 216 on the upper surface of a second interlayer dielectric (ILD) layer 214. The second ILD layer 214 may be formed substantially adjacent to the substrate surface 204 and to the upper surface of the lower metal electrodes 202. The second ILD layer 214 may comprise, in one embodiment, an insulating material, such as Silicon-dioxide ($SiO_2$), Tungsten, or Tantalum, that is approximately 100 mm thick. The second ILD layer 214 may be deposited using a chemical vapor deposition (CVD) technique in a manner known in the art. A CMP process may be used to planarize the second ILD layer 214 to within a few hundred Angstroms above the substrate surface 204, which provides enough depth for the etching of the recessed region that defines the structure of the magnetic bit shapes 216.

In one aspect, the magnetic bit shapes 216 may be formed using a pattern and etch technique to create recessed wells in the second ILD layer 214. The etching process of the recessed wells may be stopped significantly close to the upper surface of the lower metal electrodes 202 to provide an adjacent conductive contact for the subsequent formation of magnetic layers in FIG. 2C. In one aspect, the etched magnetic bit shapes 216 are elliptical in appearance and comprise sloped interior side walls. In another aspect, the etched magnetic bit shapes 116 appear as semi-spherical recessed cavities with concaved interior walls. In addition, the sloped interior side walls produce a large diameter at the top and a small diameter at the bottom of the magnetic bit shapes 216. Among other advantages, the sloped shape of the interior walls may reduce the electrical shorting of the upper electrode 224 to the edges of the magnetic memory cells, which will be discussed in greater detail in FIG. 2E. It should be appreciated that the recessed wells may be formed by using etching techniques, including anisotropic and isotropic etching, in a manner as described with reference to FIG. 1F.

Creating the recessed regions for the magnetic bit shapes 216 by patterning and etching recessed wells in the second ILD layer 214 produces a significant advantage over the prior art by allowing a CMP process to be used to define the magnetic bit shapes 216. The prior art uses a pattern and etch technique, which reduces the integrity of the magnetic stack structure 228. The sloped interior walls of the cavity help define the unique shape of the magnetic stack and present another advantage over the prior art. The unique shape of the magnetic stack structure 228 may reduce the magnetic coupling effect between the magnetic pinned layer 212 and the magnetic sense layer 220, which will be further discussed herein below.

Figure 2C:
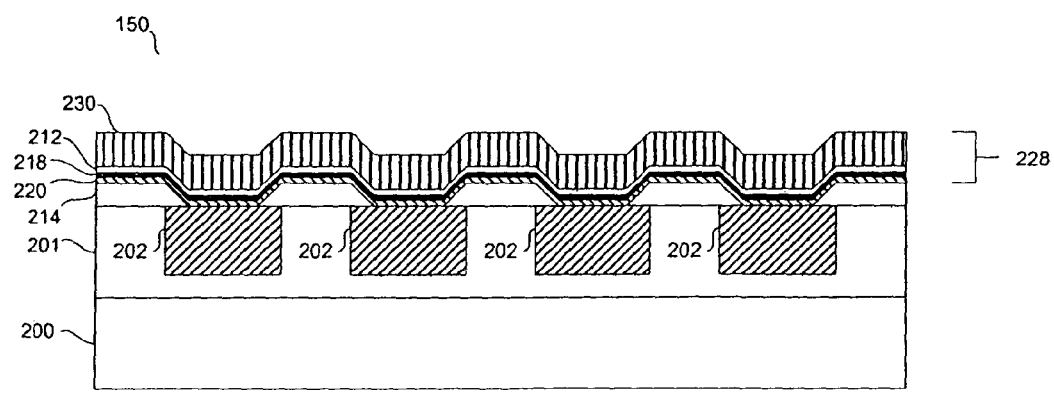

FIG. 2C illustrates the partially formed memory cell array 250 in FIG. 2B with the addition, deposition, and the formation of a contiguous magnetic stack structure 228 substantially adjacent to the upper surface of the second ILD layer 214 and the magnetic bit shapes 216. In one embodiment, the magnetic stack structure 228 comprises a lower magnetic sense layer 220, a barrier layer 218, an upper magnetic pinned layer 212, and a CMP stop layer 230.

The first contiguous layer deposited is the lower magnetic sense layer 220, which is formed substantially adjacent to the second ILD layer 214 and the lower metal electrodes 202. The lower magnetic sense layer 220 is a magnetic material comprising a layer of NiFeCo that is approximately 150 Angstroms thick. Stack layers, including the magnetic sense layer 220, are formed in a manner well known in the art by deposition techniques such as CVD, plasma enhanced CVD, sputter-deposition, physical vapor deposition, or ion-beam deposition. In addition, the lower magnetic sense layer 220 may be magnetized in a programmable first direction and acts as a first reference point for the net directional magnetization vectors for an MRAM memory cell, which will be discussed in greater detail herein below.

The second contiguous layer deposited is the barrier layer 218, which is formed substantially adjacent to the upper surface of the lower magnetic sense layer 220. In one embodiment, the barrier layer 218 comprises a layer of Aluminum-Oxide ($Al_2O_3$) that is approximately 10 to 15 Angstroms in thickness. Various fabrication techniques utilized for forming the barrier layer 218 include, first, depositing an aluminum layer in a manner well known in the art. Then, oxidation of the aluminum layer is achieved by one of several different methods: plasma oxidation, oxidation by air, and ion-beam oxidation, wherein all are derived in a manner generally known in the art. In addition, the barrier layer 218 may act as an insulation region, which resists dielectric breakdown and leakage current at low voltages.

The third contiguous layer deposited is the magnetic pinned layer 212, which is formed substantially adjacent to the upper surface of the barrier layer 218. The magnetic pinned layer 212 is a magnetic material comprising a layer of NiFe that is approximately 150 Angstroms thick. In addition, the pinned layer 212 is formed in a similar manner as the magnetic sense layer 220. In addition, the magnetic pinned layer 212 may be magnetized in a fixed second direction and acts as a second reference point for the net directional magnetization vectors for an MRAM memory cell, which will be discussed in greater detail herein below.

The fourth contiguous layer deposited is the CMP stop layer 230, which is formed substantially adjacent to the upper surface of the pinned layer 212. In one embodiment, the CMP stop layer 230 comprises an insulating material, such as Silicon-dioxide ($SiO_2$), Tungsten, or Tantalum, which may be deposited using a chemical vapor deposition (CVD) technique as is known in the art.

Figure 2D:
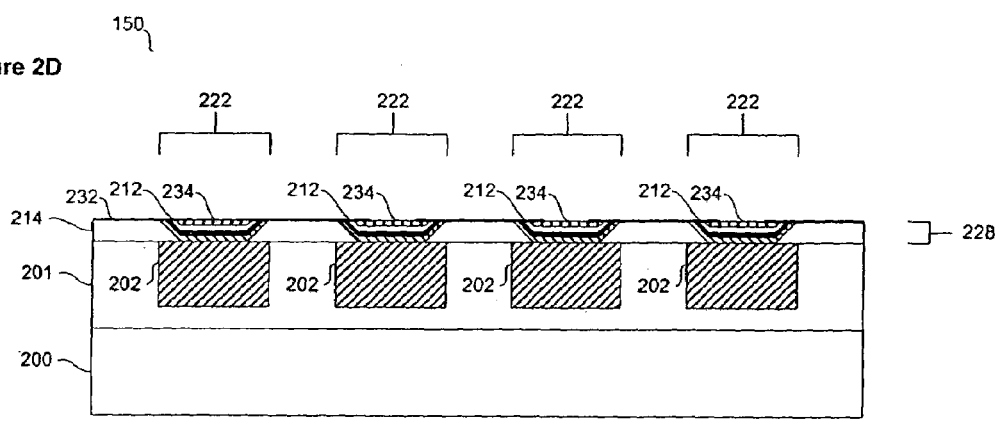

FIG. 2D illustrates the partially formed memory cell array 250 in FIG. 2C with the planarization of the magnetic stack structure 228. When the magnetic stack structure 228 is planarized substantially adjacent to the second ILD layer 214 using a CMP process, the magnetic bit shapes 216 are further defined, which also defines a plurality of magnetic bits or magnetic memory cells 222. As shown in FIG. 2D, the planarization of the magnetic stack structure 228 provides discrete magnetic bit shapes 222 having discrete pinned layers 212. Additionally, the procedure of depositing the contiguous layers 220, 218, 212, 230 and then using a CMP process to define another embodiment of a magnetic memory cells 222 reduces the need for a pattern and etching process to define the magnetic memory cells 222. The layering deposition technique in conjunction with the subsequent CMP planarization process improves the fabrication quality and efficiency by significantly reducing the edge roughness of the magnetic stack structure 228, decreasing barrier layer damage, and increasing uniform shape definition of the magnetic memory cells 222.

A thin dielectric layer 232 is then deposited on the upper surface of the second ILD layer 214 and the upper surface of the magnetic stack structure 228. The thin dielectric layer may comprise a Silicon-dioxide ($SiO_2$) material that is approximately 10 to 20 nm thick and is formed in a manner known in the art by using deposition techniques, such as CVD, plasma enhanced CVD, sputter-deposition, physical vapor deposition, or ion-beam deposition. Additionally, a plurality of via holes 234 are patterned and etched in a manner known in the art into the thin dielectric layer 232. The thin dielectric layer 232 acts as insulating barrier, which insulates the magnetic stack structure 228 from shorting at the edges to the upper metal electrodes 224, which will be discussed in greater detail in FIG. 1E. The via holes 234 provide conductive access to the upper surface of the magnetic memory cells 222, which will be discussed in greater detail herein below.

Figure 2E:
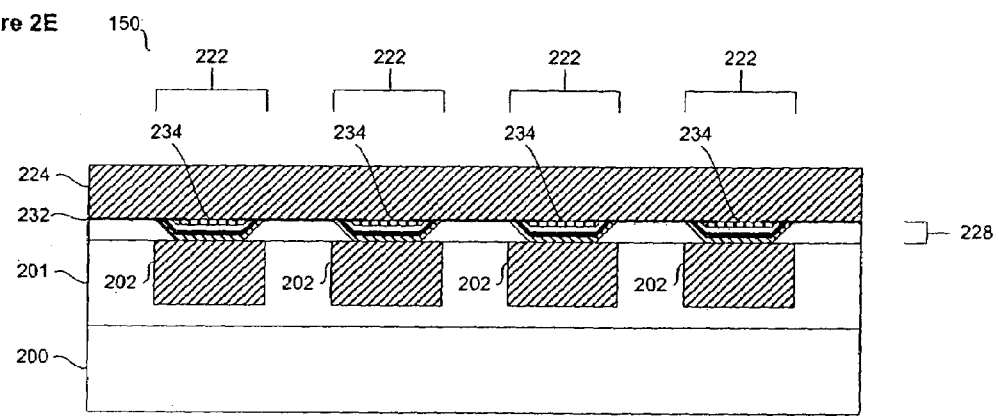

FIG. 2E illustrates the partially formed memory cell array 250 in FIG. 2D with the addition and the formation of upper metal electrodes 224 substantially adjacent to the upper surface of the thin dielectric layer 232 and the via holes 234. The upper metal electrodes 224 comprise a metallic conductive material, such as copper, and are formed in a manner known in the art by using deposition techniques, such as CVD, plasma enhanced CVD, vacuum evaporation, or sputtering techniques. Additionally, the upper metal electrodes 224 are positioned substantially parallel to each other and substantially orthogonal to the lower metal electrodes 202. This process further defines the plurality of magnetic bits or magnetic memory cells 122 in FIG. 2F, which will be discussed in greater detail herein below.

Figure 2F:
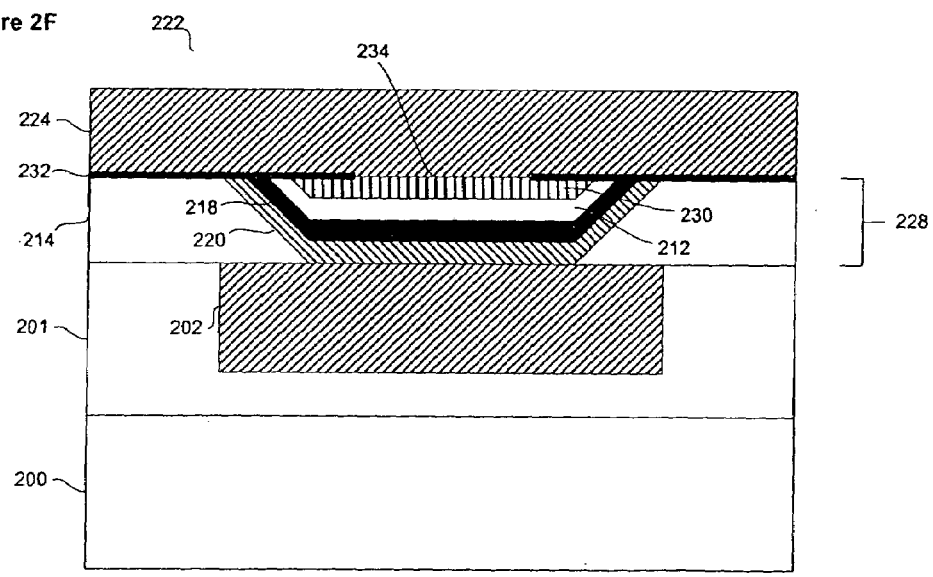

FIG. 2F illustrates the cross-sectional view of the magnetic memory cell 222. In one embodiment, each magnetic memory cell 222 comprises the lower metal electrode 202, the magnetic sense layer 220, the barrier layer 218, the magnetic pinned layer 212, CMP stop layer 230, and the upper metal electrode 224. As discussed previously, the lower metal electrode 202 is formed on the substrate 200 using a damascene process as was previously discussed in FIG. 1A.

The magnetic sense layer 220 is formed substantially adjacent to the upper surface of the lower metal electrode 202. Next, the barrier layer 218 is formed substantially adjacent to the upper surface of the magnetic sense layer 220. Then, the magnetic pinned layer 212 is formed substantially adjacent to the upper surface of the barrier layer 218. In addition, the CMP stop layer 230 is formed substantially adjacent to the upper surface of the magnetic pinned layer 212. Further, the upper metal electrode 224 is formed substantially adjacent to the upper surface of the CMP stop layer 230.

The magnetic memory cell 222 structure represents another embodiment of an MRAM memory cell structure. In one aspect, the thin dielectric layer is formed and interposed between the upper metal electrode 224 and the layers 212, 218, 220, 230 to inhibit shorting or current leakage from the layers 212, 218, 220, 230 to the upper metal electrode 224. The formation of the barrier layer 218 interposed between the magnetic sense layer 220 and the magnetic pinned layer 212 represents the magnetic stack structure 228, which is comprised by the magnetic memory cell 222.

Figure 2G:
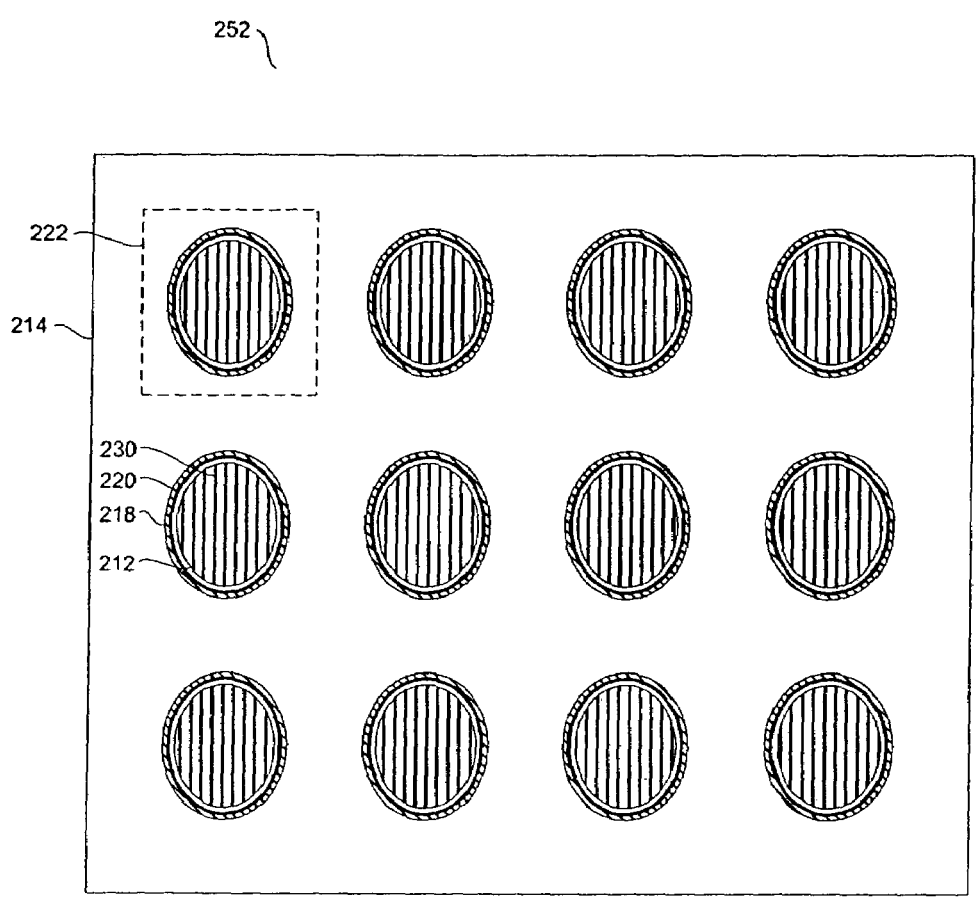

As previously described, the lower and upper metal electrodes 202, 224 provide a conductive access to the magnetic memory cell 222. The conductive access is used to store and test for digital data bits in the magnetic memory cell 222 by testing the resistance of the magnetic stack structure 228. Furthermore, the plurality of magnetic memory cells 222 are fabricated in an MRAM memory cell array 252, which is illustrated in FIG. 2G, where FIG. 2G illustrates the top view of FIG. 2D without the addition of the thin dielectric layer 232. As shown in FIG. 2G, the planarization of the magnetic stack structure, as referenced by FIG. 2F, provides an array of discrete magnetic bit shapes 222 having discrete pinned layers 212.

From the foregoing, it should be appreciated that the fabrication methods of the various MRAM magnetic memory cell structures presented hereto creates a unique magnetic bit shape and provides an exemplary MRAM device that comprises smoother edges, less barrier layer defects, and more uniform shape and structure. The MRAM magnetic memory cell structures of the above illustrated embodiments reduces the need and requirement for a pattern and etching process to define the magnetic stack structure of the various illustrated embodiments.

Forming the recessed regions for the magnetic bit shapes by patterning and etching elliptical cavities in the ILD layer produces a significant advantage over the prior art by allowing a CMP process to be used to define the unique magnetic bit shapes. Advantageously, the sloped interior walls of the elliptical cavities provide a unique formation and shaping of the magnetic stack structure, which may reduce the magnetic coupling effect between magnetic layers of the magnetic stack structure. In addition, there is also a significant improvement in the fabrication efficiencies, the device reliability, and the structural integrity, when forming the magnetic stack structure of the various illustrated embodiments. In particular, when the combination of a layering deposition technique and a CMP planarization process are utilized to define the magnetic structures, the advantages become apparent to one skilled in the art of fabricating MRAM memory cell structures.

One advantage of utilizing the combination of a layering deposition technique and a CMP planarization process is that it provides smoother edges when defining the magnetic bit shapes, which may increase the switching reliability of the MRAM device. In addition, another advantage is that utilizing the above-mentioned process may keep the barrier layer intact, which may reduce the occurrence of electrical shorting of the magnetic sense layer and/or the magnetic pinned layer to the upper and/or lower electrodes. The reduced occurrence of the electrical shorting effect may also contribute to an increase in the switching reliability of the MRAM device.

Still another advantage to the above-mentioned process is the generation of a more uniform magnetic bit shape. A more uniform magnetic bit shape may decrease the resistance and the magnetic coupling effect in the magnetic stack structure. In addition, a decrease in the coupling effect may reduce the size of the magnetic field required for switching, which may result in a lower current draw through the MRAM device. In addition, a decreased resistance through the magnetic structure may also result in a lower current draw through the MRAM device. Furthermore, a decrease in the current consumption of the MRAM device may improve the power efficiency of the MRAM device, which is an advantage to the low power requirements of modern electronic devices, such as laptop computers and cellular phones.

Still yet another advantage to the above-mentioned process is the formation of a continuous pinned layer between MRAM devices in an MRAM memory cell array. The formation of the continuous pinned layer may also contribute to the reduction of the magnetic coupling effect between the magnetic pinned layer and the magnetic sense layer of an MRAM magnetic memory cell device. By reducing the magnetic coupling effect between layers in the MRAM device, an advantageous increase in the switching reliability of the MRAM device may result from the existence of the continuous pinned layer in an MRAM memory cell array.

Although the following description exemplifies a range of preferred embodiments, it should be understood that various omissions, substitutions, and changes in the form of the detail of the apparatus, system, and method as illustrated as well as the uses thereof, may be made by those skilled in the art, without departing from the spirit of the present invention. Consequently, the scope of the present invention should not be limited to the disclosed and illustrated embodiments, but should be defined by the appended claims.

What is claimed is:

1. A method of fabricating a magnetic memory device having a magnetic stack structure interposed between a lower and upper electrode, the method comprising:
    forming an insulating layer so as to define a recessed well above the lower electrode traces, wherein defining the recessed well comprises defining a recessed well with sloped interior walls;
    forming the magnetic stack structure within the recessed wells above the lower electrode;
    planarizing the magnetic stack structure to define a magnetic bit shape using chemical-mechanical polishing; and
    forming the upper electrode on the magnetic stack structure.

2. The method of claim 1, wherein forming the lower electrode comprises depositing the lower electrode using a damascene process.

3. The method of claim 1, wherein forming the magnetic stack structure comprising forming a magnetic pinned layer, a barrier layer, and a magnetic sense layer.

4. A method of fabricating a magnetic memory device having a magnetic stack structure interposed between a lower and upper electrode, the method comprising:
    forming an insulating layer so as to define a recessed well above the lower electrode traces, wherein defining the recessed well comprises defining an elliptical recessed well with concave interior walls;
    forming the magnetic stack structure within the recessed wells above the lower electrode;
    planarizing the magnetic stack structure to define a magnetic bit shape using chemical-mechanical polishing; and
    forming the upper electrode on the magnetic stack structure.

5. A method of fabricating a magnetic memory device having a magnetic stack structure interposed between a lower and upper electrode, the method comprising:
    forming an insulating layer so as to define a recessed well above the lower electrode traces, wherein defining the recessed well comprises defining a semi-spherical recessed cavity;
    forming the magnetic stack structure within the recessed wells above the lower electrode;
    planarizing the magnetic stack structure to define a magnetic bit shape using chemical-mechanical polishing; and
    forming the upper electrode on the magnetic stack structure.

6. The method of claim 1, wherein the method further comprises forming a thin dielectric layer having a via hole interposed between the magnetic stack structure and the upper electrode.

7. The method of claim 1, further comprising forming an MRAM cell including the magnetic stack structure.

8. A method of fabricating a magnetic memory device having a magnetic stack structure interposed between a lower and upper electrode, the method comprising:
    forming an insulating layer so as to define a recessed well above the lower electrode traces, wherein forming the magnetic stack structure comprises forming a lower magnetic sense layer, a barrier layer, an upper magnetic pinned layer, and a CMP stop layer;

forming the magnetic stack structure within the recessed wells above the lower electrode;

planarizing the magnetic stack structure to define a magnetic bit shape using chemical-mechanical polishing; and forming the upper electrode on the magnetic stack structure.

9. A method of fabricating a magnetic memory device, the method comprising:

forming a first electrode having an upper exposed surface within a substrate using a damascene process;

forming a magnetic pinned layer on the upper exposed surface of the first electrode so as to establish a conductive interconnection therewith;

forming a dielectric layer adjacent to the substrate so as to provide a recessed region with sloped interior side walls adjacent to the magnetic pinned layer for the subsequent forming of an overlying barrier layer and a magnetic sense layer;

depositing the barrier layer overlying the magnetic pinned layer;

depositing the magnetic sense layer overlying the barrier layer;

planarizing the barrier layer and the magnetic sense layer so as to define at least one magnetic bit shape using a chemical-mechanical polishing technique and stopping adjacent to the dielectric layer; and forming the second electrode on the magnetic sense layer so as to establish a conductive interconnection therewith.

\* \* \* \* \*